(12) United States Patent
Peng et al.

(10) Patent No.: US 10,857,625 B2
(45) Date of Patent: Dec. 8, 2020

(54) TEXTURIZING A SURFACE WITHOUT BEAD BLASTING

(71) Applicant: Applied Materials, Inc., Santa Clara, CA (US)

(72) Inventors: Gang Peng, Fremont, CA (US); David W. Groechel, Los Altos Hills, CA (US); Jenn C. Chow, San Jose, CA (US); Tuochuan Huang, Saratoga, CA (US); Han Wang, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/532,011

(22) Filed: Aug. 5, 2019

(65) Prior Publication Data

US 2019/0358746 A1 Nov. 28, 2019

Related U.S. Application Data

(60) Division of application No. 15/955,503, filed on Apr. 17, 2018, now Pat. No. 10,434,604, which is a
(Continued)

(51) Int. Cl.
*B23K 26/352* (2014.01)
*H01J 37/32* (2006.01)
*B23K 26/12* (2014.01)

(52) U.S. Cl.
CPC .......... *B23K 26/355* (2018.08); *B23K 26/123* (2013.01); *H01J 37/32477* (2013.01); *H01J 37/32504* (2013.01)

(58) Field of Classification Search
CPC .......... B23K 26/355; B23K 26/123; B23K 2103/56; H01J 37/32477; H01J 37/32504
(Continued)

(56) References Cited

U.S. PATENT DOCUMENTS 6,506,312 B1 * 1/2003 Bottomfield .......... C23C 14/564
118/715
6,812,471 B2 * 11/2004 Popiolkowski ....... H01J 37/317
250/492.1
(Continued)

OTHER PUBLICATIONS

International Search Report and Written Opinion dated Jul. 4, 2019 for Application No. PCT/US2019/023109.
(Continued)

*Primary Examiner* — Ali Alavi
(74) *Attorney, Agent, or Firm* — Patterson + Sheridan, LLP (57) ABSTRACT

A system to provide a texture to a surface of a component for use in a semiconductor processing chamber is provided. The system includes an enclosure comprising a processing region, a support disposed in the processing region, a photon light source to generate a stream of photons, an optical module operably coupled to the photon light source, and a lens. The optical module includes a beam modulator to create a beam of photons from the stream of photons generated from the photon light source, and a beam scanner to scan the beam of photons across the surface of the component. The lens is used to receive the beam of photons from the beam scanner and distribute the beam of photons at a wavelength in a range between about 345 nm and about 1100 nm across the surface of the component to form a plurality of features on the component.

20 Claims, 10 Drawing Sheets
(4 of 10 Drawing Sheet(s) Filed in Color)

Related U.S. Application Data continuation-in-part of application No. 15/729,360, filed on Oct. 10, 2017.

(60) Provisional application No. 62/408,501, filed on Oct. 14, 2016.

(58) Field of Classification Search
USPC .......................................................... 216/65
See application file for complete search history.

(56) References Cited

U.S. PATENT DOCUMENTS

| | | | |
|---|---|---|---|
| 6,933,508 B2 | 8/2005 | Popiolkowski et al. | |
| 7,618,769 B2 * | 11/2009 | Brueckner | C23C 14/564 430/313 |
| 7,993,470 B2 | 8/2011 | West et al. | |
| 8,117,878 B1 * | 2/2012 | Popiolkowski | B21D 22/16 72/102 |
| 8,617,672 B2 | 12/2013 | Bhatnagar et al. | |
| 9,101,954 B2 * | 8/2015 | Wang | C23C 14/564 |
| 9,481,608 B2 | 11/2016 | Bhatnagar et al. | |
| 2003/0006217 A1 | 1/2003 | Dance | |
| 2003/0116276 A1 * | 6/2003 | Weldon | C04B 41/51 156/345.1 |
| 2003/0173526 A1 * | 9/2003 | Popiolkowski | C23C 16/4404 250/492.1 |
| 2003/0188685 A1 | 10/2003 | Wang et al. | |
| 2005/0048876 A1 * | 3/2005 | West | B08B 3/02 451/37 |
| 2005/0058590 A1 * | 3/2005 | Sen | B82Y 40/00 423/447.1 |
| 2009/0286382 A1 * | 11/2009 | Huff | H01L 24/83 438/455 |
| 2010/0143744 A1 | 6/2010 | Gupta et al. | |
| 2012/0258280 A1 | 10/2012 | Jackson et al. | |
| 2014/0185065 A1 * | 7/2014 | Shah | B41J 2/442 358/1.7 |
| 2014/0227820 A1 | 8/2014 | Franklin et al. | |
| 2015/0136226 A1 | 5/2015 | Guo et al. | |
| 2015/0140297 A1 * | 5/2015 | Johnson | H05K 13/046 428/10 |
| 2015/0346483 A1 * | 12/2015 | Ehrmann | G02B 15/177 219/121.85 |
| 2016/0042923 A1 | 2/2016 | Suh | |
| 2016/0265117 A1 | 9/2016 | Maloney et al. | |
| 2016/0367159 A1 | 12/2016 | Fisk | |
| 2016/0380259 A1 | 12/2016 | Yang | |

OTHER PUBLICATIONS

Taiwan Office Action dated Mar. 25, 2020 for Application No. 108113049.
Restriction Requirement dated Jan. 30, 2019 for U.S. Appl. No. 15/955,503.
Restriction Requirement dated Mar. 22, 2019 for U.S. Appl. No. 15/729,360.
Non-Final Office Action dated Oct. 31, 2019 for U.S. Appl. No. 15/729,360.
Final Office Action dated Jan. 16, 2020 for U.S. Appl. No. 15/729,360.
Non-Final Office Action dated Jun. 10, 2020 for U.S. Appl. No. 15/729,360.
Tawiwan Office Action dated Sep. 15, 2020 for Application No. 108113049.
Final Office Action dated Oct. 7, 2020 for U.S. Appl. No. 15/729,360.

* cited by examiner

TEXTURIZING A SURFACE WITHOUT BEAD BLASTING

CROSS-REFERENCE TO RELATED APPLICATION

This application is a divisional of U.S. patent application Ser. No. 15/955,503 filed Apr. 17, 2018, which is a continuation-in-part of U.S. patent application Ser. No. 15/729,360 filed Oct. 10, 2017, which claims the benefit of U.S. Provisional Patent application Ser. No. 62/408,501 filed Oct. 14, 2016, each of which is incorporated herein by reference.

BACKGROUND

Field

Embodiments of the present disclosure generally relate to a method of and a system and apparatus for texturizing a surface of a component for use in a semiconductor processing chamber.

Description of the Related Art

As integrated circuit devices continue to be fabricated with reduced dimensions, the manufacture of these devices becomes more susceptible to reduced yields due to contamination. Consequently, fabricating integrated circuit devices, particularly those having smaller physical sizes, requires that contamination be controlled to a greater extent than previously considered to be necessary.

Contamination of integrated circuit devices may arise from sources such as undesirable stray particles impinging on a substrate during thin film deposition, etching, or other semiconductor fabrication processes. In general, the manufacturing of the integrated circuit devices includes the use of chambers, including, but not limited to, physical vapor deposition (PVD) sputtering chambers, chemical vapor deposition (CVD) chambers, and plasma etching chambers. During the course of deposition and etch processes, materials often condense from the gas phase onto various internal surfaces of the chamber and surfaces of chamber components disposed within the chamber. When the materials condense from the gas phase, the materials form solid masses that reside on the chamber and component surfaces. This condensed foreign matter accumulates on the surfaces and is prone to detaching or flaking off from the surfaces during or in between a wafer process sequence. This detached foreign matter may impinge upon and contaminate the wafer and devices formed thereon. Contaminated devices frequently must be discarded, thereby decreasing the manufacturing yield of the process.

In order to prevent detachment of foreign matter that has formed, the internal surfaces of the chamber and the surfaces of chamber components disposed within the chamber may be provided with a particular surface texture. The surface texture is configured such that the foreign matter that forms on these surfaces has enhanced adhesion to the surface and is less likely to detach and contaminate a wafer. A key parameter of the surface texture is the surface roughness.

One common texturizing process is bead blasting. In a bead blasting process, solid blasting beads are propelled towards the surface to be texturized. One manner in which the solid blasting beads can be propelled towards the surface to be texturized is by pressurized gas. The solid blasting beads are made of a suitable material, for example, aluminum oxide, glass, silica, or hard plastics. Depending upon the desired surface roughness, the blasting beads can be of varying sizes and shapes.

However, it can be difficult to control the uniformity and repeatability of the bead blasting process. Moreover, during the bead blasting process, the surface being texturized may become sharp and jagged such that tips of the surface break off because of the impact of the solid blasting beads, thereby introducing a source of contamination. In addition, the blasting beads may become entrapped or embedded within the surface during the bead blasting process. For example, if the surface being texturized includes a small through-hole of a varying width (e.g., a gas distribution showerhead), the blasting bead may become entrapped within the through-hole. In such a situation, the blasting bead not only prevents the through-hole from functioning as a gas passageway, for example, but it also introduces a potential source of contamination for a wafer.

An electromagnetic beam can also be used to texturize a chamber surface. Using an electromagnetic beam to texturize a chamber surface may overcome some of the above-identified problems associated with bead blasting. However, the electromagnetic beam must be operated under vacuum to prevent scattering. Scattering can occur when electrons within the electromagnetic beam interact with air or other gas molecules. Consequently, the electromagnetic beam must be operated within a vacuum chamber. The need for a vacuum chamber limits the size of components that can be texturized because the component must be able to fit within the vacuum chamber. Moreover, the capital costs associated with operating an electromagnetic beam are significantly higher than the capital costs associated with bead blasting process. For example, the need for a vacuum chamber increases the costs associated with texturing a surface with an electromagnetic beam.

Therefore, there is a need for an improved texturizing process that overcomes the problems associated with bead blasting while avoiding the capital costs and size constraints associated with the use of an electromagnetic beam.

SUMMARY

One implementation of the present disclosure relates to a method of providing a texture to a surface of a component for use in a semiconductor processing chamber. The method includes directing a beam of photons through ambient air or nitrogen at the surface of the component; and scanning the beam of photons across a first region of the surface of the component to form a plurality of features on the surface within the first region, wherein the features that are formed are depressions, protuberances, or combinations thereof.

Another implementation of the present disclosure relates to a method of providing a texture to a surface of a component for use in a semiconductor processing chamber. The method includes directing a beam of photons at the surface of the component in an atmosphere having a pressure generally equivalent to atmospheric pressure; and scanning the beam of photons across a first region of the surface of the component to form a plurality of features on the surface within the first region, wherein the features that are formed are depressions, protuberances, or combinations thereof.

Another embodiment of the present disclosure is a component for use in a semiconductor processing chamber. The component includes a plurality of features on a surface within a first region, wherein the features that are formed are depressions, protuberances, or combinations thereof. The features are formed by scanning a beam of photons across the surface of the component.

Another embodiment of the present disclosure is a system to provide a texture to a surface of a component for use in a semiconductor processing chamber is provided. The system includes an enclosure comprising a processing region, a support disposed in the processing region and comprising a supporting surface, a photon light source to generate a stream of photons, an optical module operably coupled to the photon light source to receive the stream of photons from the photon light source, and a lens. The optical module includes a beam modulator to create a beam of photons from the stream of photons generated from the photon light source, and a beam scanner to scan the beam of photons across the surface of the component. The lens is used to receive the beam of photons from the beam scanner and distribute the beam of photons at a wavelength in a range between about 345 nm and about 1100 nm across the surface of the component to form a plurality of features on the component.

Another embodiment of the present disclosure is a method of providing a texture to a surface of a component for use in a semiconductor processing chamber. The method includes generating a stream of photons, shaping the stream of photons into a beam, scanning the beam of photons through a processing region that comprises a gas concentration of ambient air or nitrogen with a pressure generally equivalent to atmospheric pressure towards the surface of the component, and distributing the beam of photons across the surface of the component to form a plurality of features on the surface.

Further, yet another embodiment of the present disclosure is a system to provide a texture to a surface of a component for use in a semiconductor processing chamber. The system includes an enclosure comprising a processing region maintained as a Class 1 environment with a pressure generally equivalent to atmospheric pressure, a support disposed in the processing region and comprising a supporting surface, a photon light source to generate a stream of photons, an optical module operably coupled to the photon light source to receive the stream of photons from the photon light source, and a lens. The optical module includes a beam modulator to create a beam of photons from the stream of photons generated from the photon light source and a beam scanner to scan the beam of photons across the surface of the component. The lens is disposed in the processing region to receive the beam of photons from the beam scanner and distribute the beam of photons at a wavelength in a range between about 345 nm and about 1100 nm across the surface of the component to form a plurality of features on the component.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope.

FIGS. 5 and 6 illustrate a surface morphology of a repeating random form, the surface morphology being created by a laser machine in accordance with the present disclosure.

FIGS. 7 and 8 illustrate a surface morphology of a repeating wave form, the surface morphology being created by a laser machine in accordance with the present disclosure.

FIGS. 9 and 10 illustrate a surface morphology of a repeating square form, the surface morphology being created by a laser machine in accordance with the present disclosure.

To facilitate understanding, identical reference numerals have been used, where possible, to designate identical elements that are common to the figures. It is contemplated that elements and features of one implementation may be beneficially incorporated in other implementations without further recitation.

The patent or application file contains at least one drawing executed in color. Copies of this patent or patent application publication with color drawing(s) will be provided by the Office upon request and payment of the necessary fee.

DETAILED DESCRIPTION

Implementations described herein utilize a beam of photons generated by a laser to perform a texturizing process on a surface of a component for use in a semiconductor processing chamber. The beam of photons is directed at the surface of the component and scanned across a region of the surface to form a plurality of features. The features formed on the surface include depressions, protuberances, and/or combinations thereof. The beam of photons may be reduced in intensity, defocused, and/or scanned at a particular travel speed to form a desired surface morphology.

Figure 1:
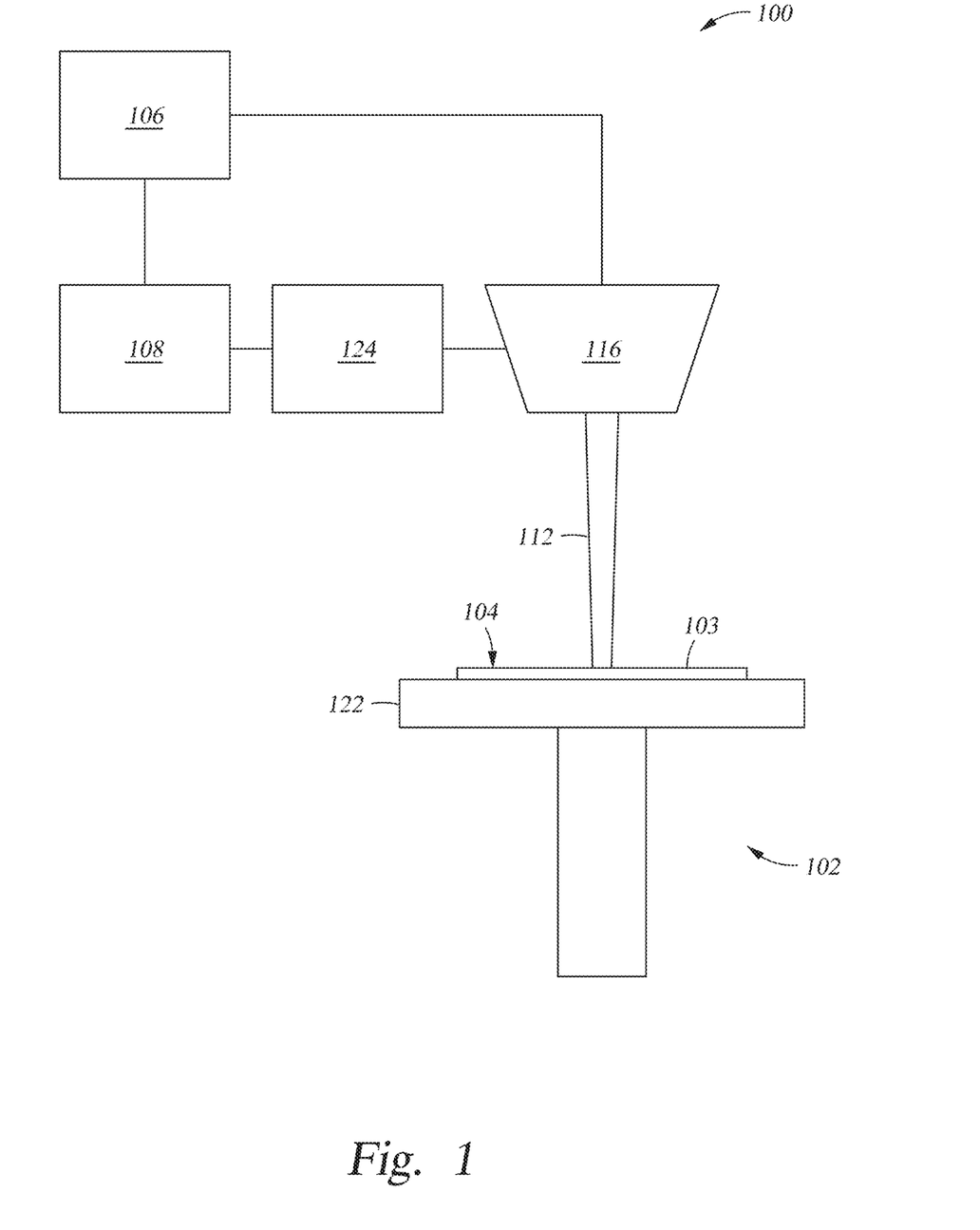
FIG. 1 illustrates a schematic view of a laser machine and a support system in accordance with the present disclosure.

FIG. 1 depicts a schematic view of a laser machine 100 that may be used to texturize a surface 103 of a component 104 and a support system 102. The component 104 may be, for example, a gas distribution showerhead, a chamber wall, or an electrostatic chuck. The laser machine 100 comprises a power supply 106, a controller 108, and a laser device 116. The laser device 116 outputs a beam of photons 112. The controller 108 may comprise a modulator and/or a scanner to modulate and scan the beam of photons 112. The laser machine may further comprise a pulse supply unit to pulse the beam of photons 112. Pulsing the beam of photons 112 can help minimize the amount of heat applied to the surface 103 of the component 104. In addition, pulsing the beam of photons 112 can help reduce problems incurred as a result of the reflectivity of the surface 103 of the component 104. Embodiments disclosed herein may be utilized to texturize the surface 103 of the component 104 to have an arithmetic average of the roughness profile (Ra) of about 60 μin to about 360 μin.

The component 104 may comprise a material such as a metal or metal alloy, a ceramic material, a polymer material, a composite material, or combinations thereof. In one implementation, the component 104 comprises a material selected from the group comprising steel, stainless steel, tantalum, tungsten, titanium, copper, aluminum, nickel, gold, silver, aluminum oxide, aluminum nitride, silicon, silicon nitride, silicon oxide, silicon carbide, sapphire ($Al_2O_3$), silicon nitride, yttria, yttrium oxide, and combinations thereof. In one implementation, the component 104 comprises metal alloys such as austenitic-type stainless steels, iron-nickel-chromium alloys (e.g., Inconel™ alloys), nickel-chromium-molybdenum-tungsten alloys (e.g., Hastelloy™), copper zinc alloys, chromium copper alloys (e.g., 5% or 10% Cr with balance Cu), or the like. In another implementation, the component comprises quartz. The component 104 may also comprise polymers such as polyimide (Vespel™), polyetheretherketone (PEEK), polyarylate (Ardel™), and the like. In yet another implementation, the component 104 may comprises a material such as gold, silver, aluminum silicon, germanium, germanium silicon, boron nitride, aluminum oxide, aluminum nitride, silicon, silicon nitride, silicon oxide, silicon carbide, yttria, yttrium oxide, non-polymers, and combinations thereof.

The support system 102 may be positioned downstream of the laser machine 100. The support system 102 comprises a support 122, such as similar to a substrate support in one or more embodiments, for supporting component 104. The support system 102 and laser machine 100 are positioned relative to each other such that the beam of photons 112 output by the laser device 116 is directed at the surface 103 of the component 104. In one implementation of the present disclosure illustrated in FIG. 1, the laser machine 100 may further comprise an actuating means 124 for adjusting the position of the output of the laser device 116. In such an implementation, the support 122 may remain stationary and the actuating means 124 may adjust the position of output of the laser device 116, thereby causing the beam of photons 112 output by the laser device 116 to be scanned across the surface 103. In an alternative implementation of the present disclosure illustrated in FIG. 2, the support system 102 may comprise the actuating means 124 for moving the support 122. In such an implementation, the output of the laser device 116 may remain stationary and the actuating means 124 may adjust the position of the support 122, thereby causing the beam of photons 112 output by the laser device 116 to be scanned across the surface 103. The actuating means 124 for adjusting the position of either the laser device 116 or the support 122 may comprise, for example, an X-Y stage, an extension arm and/or rotating shaft capable of translational movement and/or rotational movement.

Figure 2:
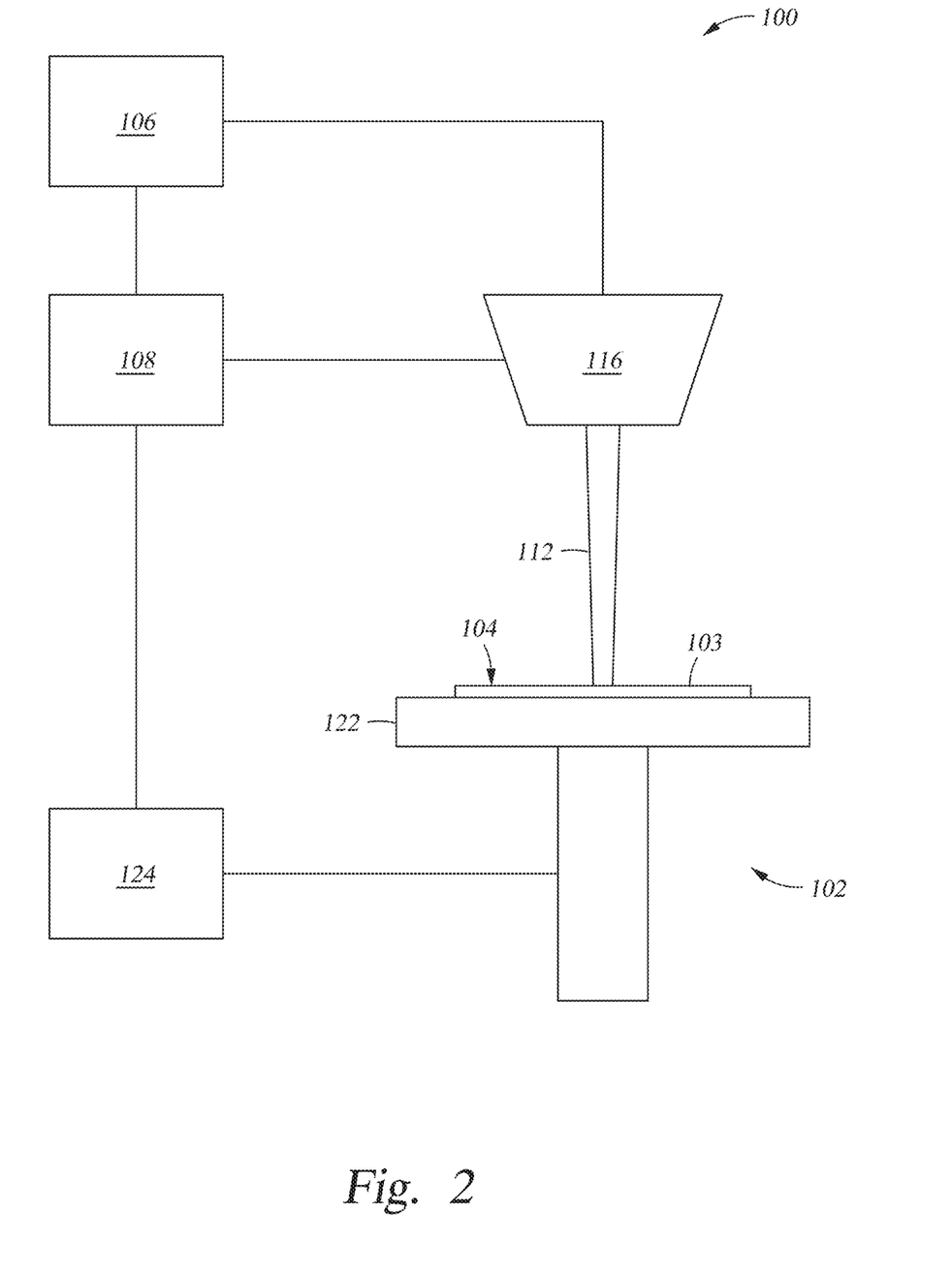
FIG. 2 illustrates an alternative schematic view of a laser machine and a support system in accordance with the present disclosure.

The controller 108 may be connected to the laser device 116 in a manner that enables the controller to control various parameters associated with the beam of photons 112 output by the laser device 116. In particular, the controller 108 may be connected to the laser device 116 to control at least the following parameters associated with the beam of photons 112: wavelength, pulse width, repetition rate, travel speed, power level, and beam size. By being able to control these various parameters associated with the beam of photons 112, the controller 108 is able to dictate the surface morphology formed on the surface 103 of the component 104. It should be understood that "travel speed" incorporates an implementation where the beam of photons 112 is being moved and the component 104 is stationary and an implementation where the beam of photons 112 is stationary and the component is being moved. As shown in FIG. 2, the controller 108 may also be connected to the support system 102 in a manner that enables the controller to control an actuating means 124 connected to the support 122. Alternatively, a secondary controller may be connected to the support system 102 to control an actuating means 124 connected to the support 122.

The controller 108 may be one of any form of general purpose computer processor (CPU) that can be used in an industrial setting. The computer may use any suitable memory, such as random access memory, read only memory, floppy disk drive, hard disk, or any other form of digital storage, local or remote. Various support circuits may be coupled to the CPU for supporting the processor in a conventional manner. Software routines as required may be stored in the memory or executed by a second CPU that is remotely located. The software routine, when executed, transforms the general purpose computer into a specific process computer that controls the operation so that a chamber process is performed. Alternatively, the implementation described herein may be performed in hardware, as an application specific integrated circuit or other type of hardware implementation, or a combination of software or hardware.

The laser device 116 of the laser machine 100 may have a power output in a range of about 3 W to about 30 W. Alternatively, the laser machine may have a power output in a range of about 1 W to about 150 W. The laser device 116 may also be capable of pulsing and varying parameters associated with the beam of photons 112 (e.g., wavelength, pulse width, pulse frequency, repetition rate, travel speed, power level, and beam size), which are discussed more below. The laser device 116 of the laser machine 100 may be a commercially available laser. An example of a commercially available laser machine that may be in accordance with the present disclosure is IPG YLPP laser of Spectral Physics Quanta-Ray Laser.

The laser machine 100 and the support system 102 do not require a vacuum environment to perform the texturizing process because the output of the laser device 116 is a beam of photons 112. The output of the laser device 116 thus differs from a conventional electromagnetic beam generating system in which an electron-beam is used to perform the texturizing process. An electromagnetic beam system typically requires a vacuum environment (e.g., a vacuum chamber) due to the interaction and scattering of the electrons with ambient gas atoms, and thus the vacuum environment is necessary to maintain precise control of the electron beam. As discussed above, the requirement of the vacuum environment imposes physical constraints on the size of component that can be texturized using the electromagnetic beam system, as the component must be able to fit within the vacuum chamber. In addition, the requirement of the vacuum environment increases the complexity of the electromagnetic system because the vacuum chamber must include special equipment (e.g., a pump, sensors, seals). Consequently, electromagnetic beam systems have significantly higher capital costs than that which would be incurred when using the laser machine 100 and the support system 102 discussed in the present disclosure to perform the texturizing process.

Thus, the laser machine 100 and the support system 102 can be used in an ambient air environment in which the air through which the beam of photons 112 passes is approximately 78% nitrogen and approximately 21% oxygen. In some situations, however, it may be desirable to locate the laser machine 100 and the support system 102 within an oxygen-depleted environment. In such a situation, the laser machine 100 and the support system 102 can be positioned within a chamber where nitrogen gas is used in place of ambient air. Because a vacuum is not required, the pressure within the chamber can be maintained at atmospheric pressure. It is to be understood that "atmospheric pressure" may differ from one location to another. In some embodiments, the pressure in the region in which the component 104 is disposed during processing may be unregulated.

Figure 3:
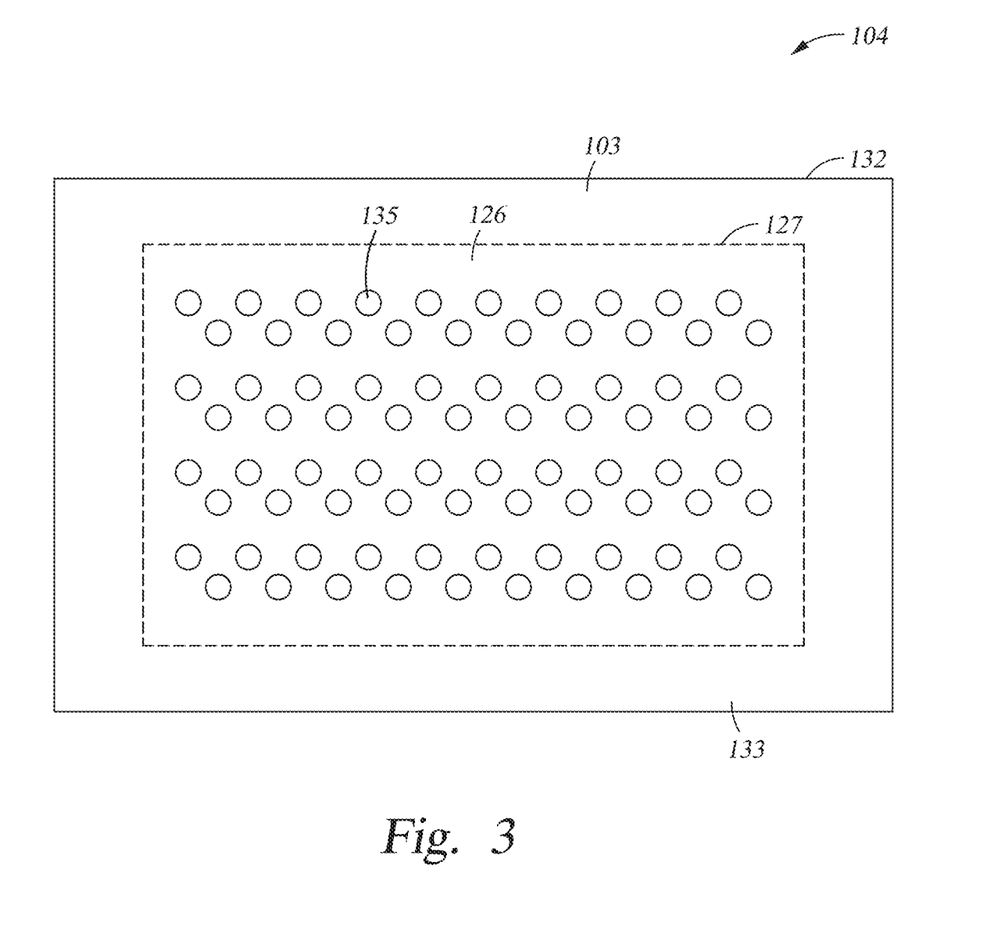
FIG. 3 illustrates a top view of a gas distribution showerhead, with a region to be texturized marked by boundary lines, in accordance with the present disclosure.
Figure 4:
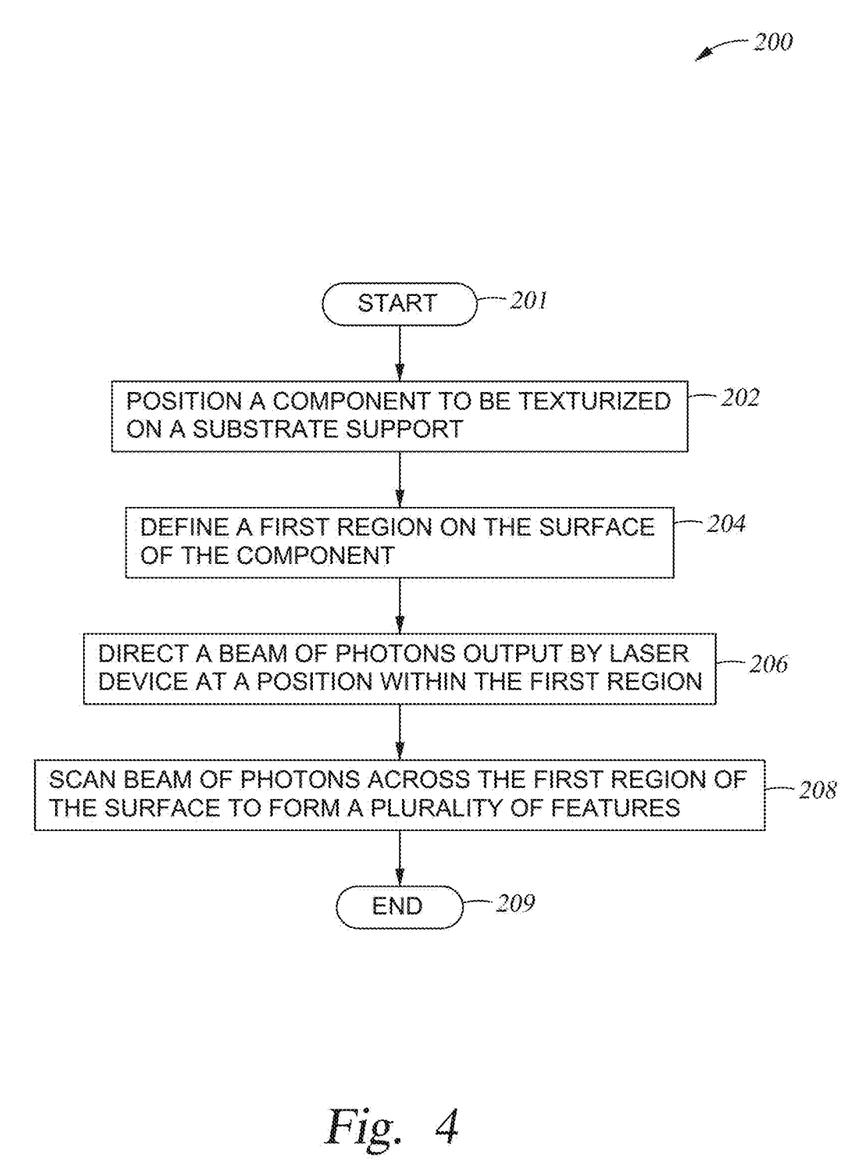
FIG. 4 illustrates a process sequence for a method of operating a laser machine and a support system in accordance with the present disclosure.

FIG. 4 depicts a process sequence 200, which begins at 201 and ends with 209, for a method of operating the laser machine 100 and the support system 102. At box 202, the component 104 is positioned on the support 122. At box 204, a first region 126 is defined on the surface 103 of the component 104. As illustrated in FIG. 3, in which component 104 is a gas distribution showerhead 133 having a plurality of through-holes 135, the first region 126 has a first outer boundary 127 defining the outer bounds of the first region. The first outer boundary 127 defines a first surface area. A ratio of the first surface area to a second surface area of the component 104 may be at least 0.6. The second surface area of the component 104 is defined by a second outer boundary 132 of the surface 103 being texturized. Thus, the first surface area, which is positioned within the second surface area, may be at least 60% of the second surface area. It is to be understood that the size of the first and second surface areas will vary depending upon the shape and size of the component 104 that is being texturized. Alternatively, the ratio of the first surface area to the second surface area may be greater than 0.7, 0.8, and/or 0.9.

At box 206, the laser machine 100 is powered via power supply 106 such that the laser device 116 outputs a beam of photons 112. As discussed above, controller 108 of the laser machine 100 can vary the parameters associated with the beam of photons 112 depending upon the desired texture on the surface 103. In one implementation, the beam of photons 112 may have a wavelength in a range between about 345 nm and about 1100 nm. In another implementation, the beam of photons may have a wavelength in the ultra-violet light range (about 170 nm to about 400 nm). In yet another implementation, the beam of photons may have a wavelength in the infrared light range (about 700 nm to about 1.1 mm). The beam of photons 112 outputted by the laser device 116 is directed towards the surface 103 of the component 104 at a position within the first region 126. The beam of photons 112 may have a beam diameter at the surface 103 of the component 104 in a range of about 7 μm to about 75 μm. Alternatively, the beam of photons 112 may have a beam diameter at the surface 103 of the component 104 in a range of about 2.5 μm to about 100 μm. In one implementation, the working distance traveled by the beam of photons 112 is about 50 millimeters to about 1,000 millimeters. In another implementation, the working distance traveled by the beam of photons 112 is between about 200 millimeters to about 350 millimeters. As the laser device 116 of the laser machine 100 may have a power output in a range of about 1 W to about 150 W, the beam of photons 112 may have a pulse power in a range of about $10 \times 10^{-6}$ J to about $400 \times 10^{-6}$ J. The beam of photons 112 may have a pulse width in a range between about 10 ps to about 30 ns. Further, the beam of photons 112 may have a pulse repetition rate in a range between about 10 KHz to about 200 KHz in one embodiment, and more particularly in a range between about 10 KHz to about 3 MHz in another embodiment. The controller 108 may be used to control the pulse width and/or the pulse repetition rate of the laser device 116.

At box 208, the beam of photons 112 is scanned across the first region 126 of the surface 103, thereby forming a plurality of features on the surface. The beam of photons 112 may be scanned across the first region 126 of the surface 103 at a travel speed in a range of about 0.1 m/s to about 30 m/s, such as while the beam of photons 112 is pulsed from the laser device 116. As can be seen in FIGS. 5-10, the features that are formed as a result of the beam of photons 112 being scanned across the first region 126 of the surface 103 include depressions, protuberances, or combinations thereof. The controller 108 can be programmed to vary certain parameters associated with the beam of photons 112 as the beam is being scanned across the first region 126. For example, the controller 108 can pulse the beam of photons 112 while the beam is being scanned across the first region 126. In one implementation, the controller 108 may control the laser device 116 to have a pulse width in a range of about 0.2 ns to about 100 ns. In one embodiment, the controller 108 may control the laser device 116 to have a pulse width in a range of about 400 fs to about 200 ns.

In this manner, the laser machine 100 can be used to form an overall surface morphology for the first region.

Figure 5:
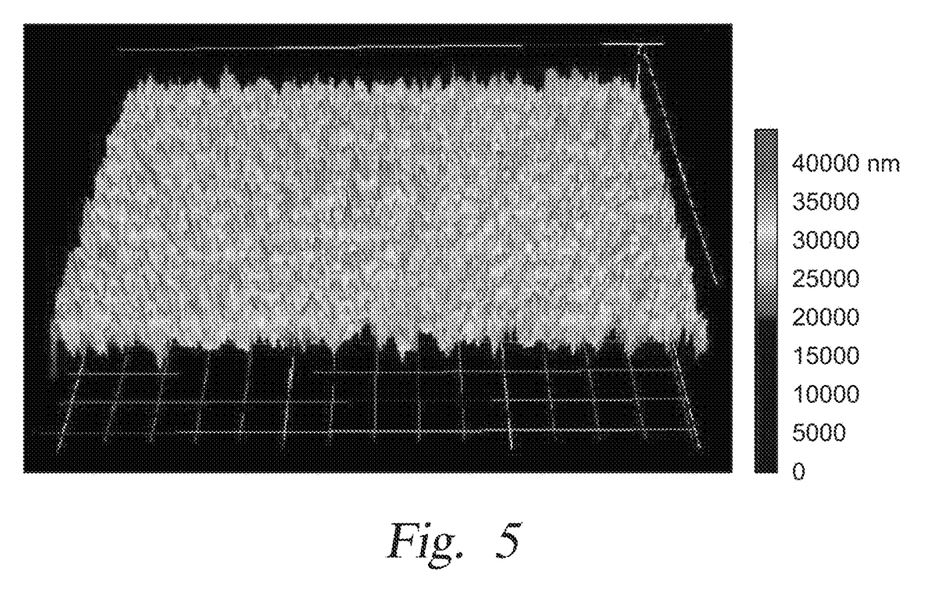
FIG. 5 illustrates a perspective view showing the surface morphology and FIG. 6 illustrates a top view showing the surface morphology.
Figure 6:
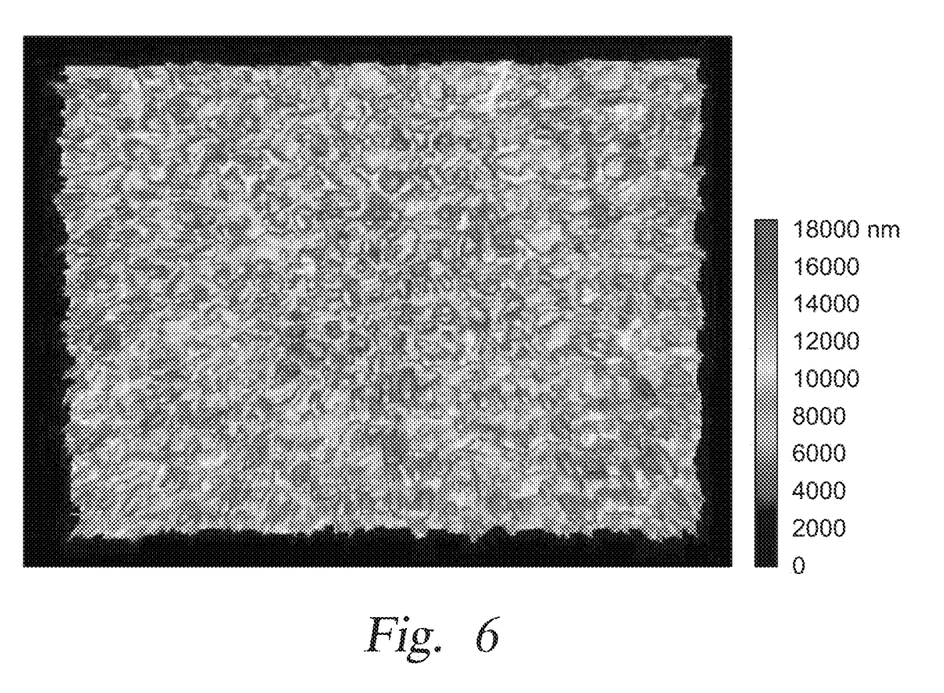

Depending upon the situation, the laser machine 100 can be used to form three different types of surface morphologies for the first region 126. The first surface morphology is a repeating random form, as shown in FIGS. 5 and 6, wherein the repeating random form generates a combination of protuberances and depressions. It is to be understood that the plurality of protuberances may have, for example, a flat surface and a convex surface. In FIGS. 5 and 6, the highest variation in elevation from the lowest depression to the highest protuberance is in a range of about 4,000 nm to about 4,500 nm. Because the surface morphology is a repeating random form, the protuberances and depressions do not form a periodic wave.

A repeating form may be achieved by synchronizing pulse frequency and scan rate. As the pulsing laser and substrate move with respect to each other, the laser emits radiation that impacts the substrate surface at a repeating interval, resulting in a repeating form. The exact shape of the repeating form can be adjusted by adjusting the temporal profile of the laser pulses to the scan rate. If a laser pulse with very fast power ramp time, compared to the scan rate, is used, the repeating form will tend toward a substantially rectangular profile because the substrate does not translate far during the ramp-up or ramp-down. If ramp time is very small compared to pulse duration, the repeating form will also tend toward a substantially rectangular profile because the temporal profile of the laser pulse is substantially flat. If scan rate is low compared with pulse duration or ramp time, the repeating form will also tend toward a substantially rectangular profile because the photons delivered by each laser pulse are concentrated in a smaller region of the substrate. Increasing ramp time and/or scan rate relative to pulse duration will result in more rounded or tapered corners of the formed features. The laser pulses themselves can also be modulated by coupling a waveform generator to the laser power supply. In this way, pulses can be generated with more tapered ramp rates, and even sinusoidal temporal profiles. Such measures will result in features that tend toward a wave shape. Feature pitch is determined by the relationship of pulse frequency to scan rate. Thus, feature pitch can be adjusted independently by adjusting pulse frequency, which will be limited at the high end by pulse duration.

An example of the Ra of the repeating random form shown in FIGS. 5 and 6 is about 60 μin when the power output of the laser machine 100 is 30 W, the component 104 is aluminum, and the beam diameter is about 7 μm. It is to be understood that the Ra value will vary depending upon the power output of the laser machine 100 and the various variables associated with beam of photons 112. The repeating random form achieved using the laser machine 100 may have a similar surface morphology and Ra value to that which can be achieved using a bead blasting process, with the exception that use of the laser machine 100 will avoid some of the problems inherent with the bead blasting process. For example, if the component 104 is a gas distribution showerhead 133 (illustrated schematically in FIG. 3), there will be plurality of through-holes 135 that are tapered. As discussed above, the bead blasting process involves blasting a plurality of beads at the surface to be textured at a high velocity. Consequently, there is an inherent lack of control and precision associated with the bead blasting process.

Beads used in the bead blasting process may also become entrapped or embedded within the through-holes 135. Additionally, the beads may strike a corner or edge of the through-holes 135, undesirably altering the profile of the through-holes rather than texturizing surface 103. Using the laser machine 100 to texturize the gas distribution showerhead 133 with the repeating random form surface morphology will not alter the boundary profile of the through-holes 135 in the showerhead 133 as significantly because of the higher precision that can be achieved through this texturing process. The laser machine 100 may texturize surface 103 within the first region 126 such that repeating random form continually repeats itself within first outer boundaries 127.

Figure 7:
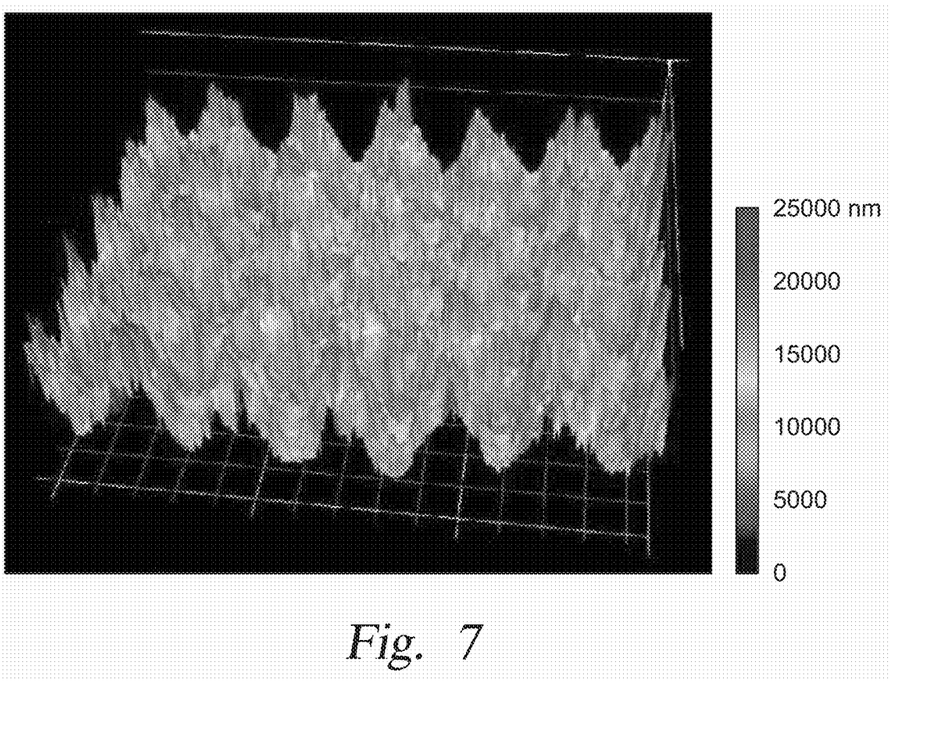
FIG. 7 illustrates a perspective view showing the surface morphology and FIG. 8 illustrates top and side views showing the surface morphology.
Figure 8:
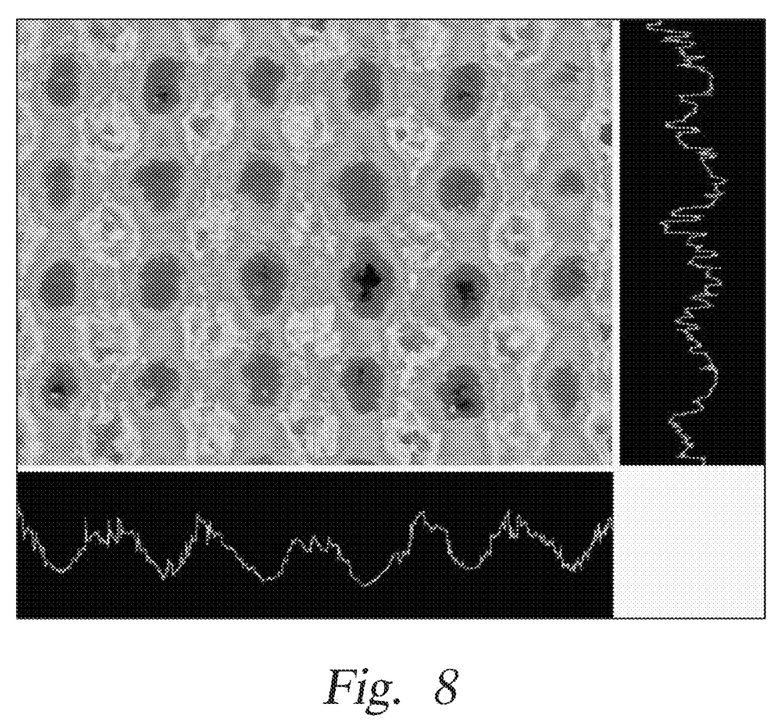

The second surface morphology is a repeating wave form, as shown in FIGS. 7 and 8, wherein the repeating wave form generates a combination of protuberances and depressions. It is to be understood that the plurality of protuberances may have, for example, a generally convex surface. In FIGS. 7 and 8, the highest variation in elevation from the lowest depression to the highest protuberance is in a range of about 4,000 nm to about 4,500 nm. Because the surface morphology is a repeating wave form, the protuberances and depressions form a periodic profile where each of the plurality of protuberances come to a generally convex, pointed portion. The periodic profile associated with the repeating wave form repeats itself throughout the first region 126 of the surface 103 along both an x-axis of the surface and a y-axis of the surface.

An example of the arithmetic average of the roughness profile (Ra) of the repeating wave form shown in FIGS. 7 and 8 is about 108 μin when the power output of the laser machine 100 is 30 W, the component 104 is aluminum, and the beam diameter is about 7 μm. It is to be understood that the Ra value will vary depending upon the power output of the laser machine 100 and the various variables associated with beam of photons 112. Unlike the repeating random form, the repeating wave form differs from the surface morphology typically achieved using the bead blasting process. The laser machine 100 may texturize surface 103 within the first region 126 such that repeating wave form continually repeats itself within first outer boundaries 127.

Figure 9:
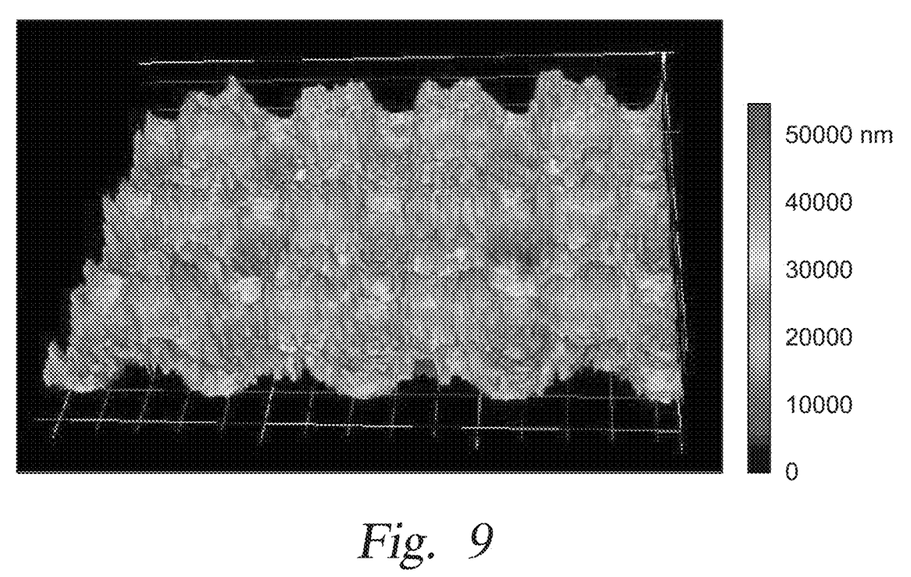
FIG. 9 illustrates a perspective view showing the surface morphology.
Figure 10:
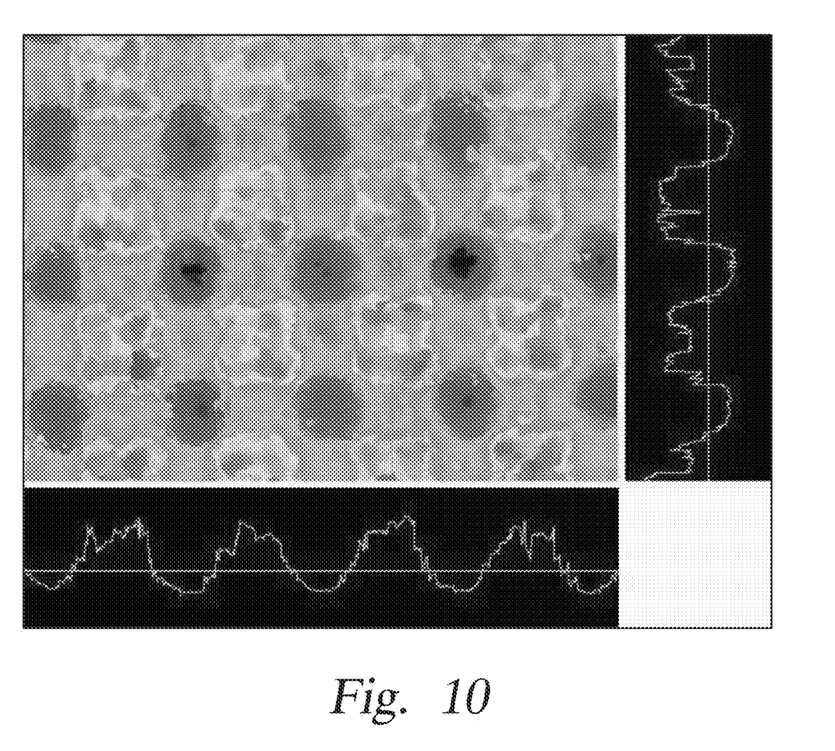
FIG. 10 illustrates top and side views showing the surface morphology.

The third surface morphology is a repeating square form, as shown in FIGS. 9 and 10, wherein the repeating square form generates a combination of protuberances and depressions. It is to be understood that the plurality of protuberances may have, for example, a generally flat surface. In FIGS. 9 and 10, the highest variation in elevation from the lowest depression to the highest protuberance is in a range of about 4,000 nm to about 4,500 nm. Because the surface morphology is a repeating square form, the protuberances and depressions form a periodic profile where each of the plurality of protuberances comes to a generally flat portion. The periodic profile associated with the repeating square form repeats itself throughout the first region 126 of the surface 103 along both an x-axis of the surface and a y-axis of the surface.

An example of the arithmetic average of the roughness profile (Ra) of the repeating square form shown in FIGS. 9 and 10 is about 357 μin when the power output of the laser machine 100 is 30 W, the component 104 is aluminum, and the beam diameter is about 25 μm. It is to be understood that the Ra value will vary depending upon the power output of the laser machine 100 and the various variables associated with beam of photons 112. The repeating square form may be particularly applicable when the component 104 is an electrostatic chuck. As best seen in FIG. 9, the protuberances and depressions within the repeating square form result in a plurality of passageways. The plurality of passageways enable gas to be passed through the passageways underneath a silicon wafer, for example, that is sitting on top of the electrostatic chuck during wafer processing.

A subsequent polishing process may be performed after the texturizing process to help planarize top surfaces of the protuberances, thereby helping the adhesion of the silicon wafer to the electrostatic chuck during wafer processing. The portion of the component 104 not planarized during the polishing process will retain a surface roughness, thereby aiding in the prevention of detachment of foreign matter that has condensed within the plurality of passageways during wafer processing. The laser machine 100 may texturize surface 103 within the first region 126 such that repeating square form continually repeats itself within first outer boundaries 127.

Another benefit associated with the use of the laser machine 100 is that the surface 103 of the component 104 that is being texturized does not have to undergo a precision pre-cleaning process before box 202 of the process. Instead, all that is required is a rough pre-cleaning process to degrease the surface 103 of the component 104. This differs from an electromagnetic beam system, in which a precision pre-cleaning process is generally required because of the highly reactive nature of the electron beam.

Yet another benefit associated with the use of laser machine 100 to texturize the surface 103 of the component 104 is that after box 202, there is not an additional step of pumping down the pressure within a vacuum chamber, as is the case when an electromagnetic beam system is being used. As discussed above, the electromagnetic beam system is operated within a vacuum environment, thereby requiring the pressure of the environment to be pumped down. While laser machine 100 and support system 102 may be positioned within a chamber for the purpose of creating an oxygen-depleted environment, the environment pressure does not have to be pumped down. Because this pumping down step is eliminated, the time required to texturize the surface 103 of component 104 with the laser machine 100 is less than the time required to texturize the surface of the component with an electron beam. This helps increase the throughput associated with texturizing the surface of components with the laser machine 100 as compared to texturizing the surface of components using an electromagnetic beam system. The throughput associated with the laser machine 100 is also greater than the throughput associated with using an electromagnetic beam system because the travel speed at which an electron beam can be scanned across a surface to form a plurality of features is significantly less than the travel speed at which the beam of photons 112 can be scanned across the surface. For example, the travel speed of an electron beam is in a range of about 0.02 M/s about 0.03 M/s when texturizing a surface. As discussed above, the travel speed of the beam of photons 112 has a range of about 0.1 M/s to about 300 M/s when texturizing a surface.

Another benefit associated with texturizing the surface 103 of the component 104 utilizing the beam of photons 112 output by the laser device 116 is that it may create a cleaner process than using, for example, bead blasting or an electron beam. Depending upon the wavelength of the beam of photons 112, the material of the surface 103 on which the beam of photons is directed may receive primarily optical radiation or thermal energy to modify the surface. The optical radiation melts the surface 103 of the component 104 at the location on which the beam of photons is directed, thereby creating molten material or slag that, when re-solidified, creates either a depression or protuberance. Because kinetic energy associated with the molten material can be minimalized, the molten material is less likely to be knocked from the remaining surface 103 and redeposited at some other location. This reduces the amount of re-deposition that might otherwise occur. Conversely, when using an electromagnetic beam system, the component being texturized is often embedded with electrons that interact with the electron beam, creating significant energy that results in at least some of the molten material being knocked from the remaining surface and thereby increasing the likelihood of re-deposition. Consequently, texturizing a surface with the beam of photons 112 may result in a cleaner process than texturizing a surface with an electron beam.

It is to be noted that the beam of photons 112 delivered to the surface 103 of the component 104 by the laser device 116 is not intended to cause significant or gross distortion (e.g., melting, warping, cracking, etc.) of the component 104. Significant or gross distortion of the component 104 can be generally defined as a state where the component 104 is not able to be used for its intended purpose due to the application of the texturizing process.

Figure 11:
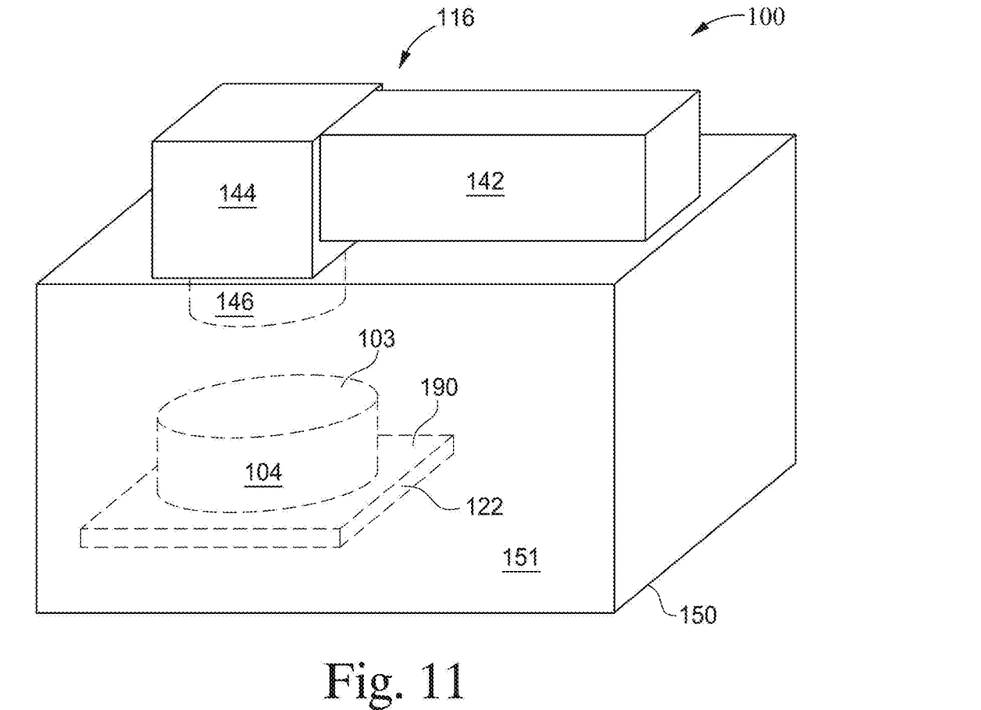
FIG. 11 illustrates a schematic view of a laser machine and a laser device in accordance with the present disclosure.
Figure 12:
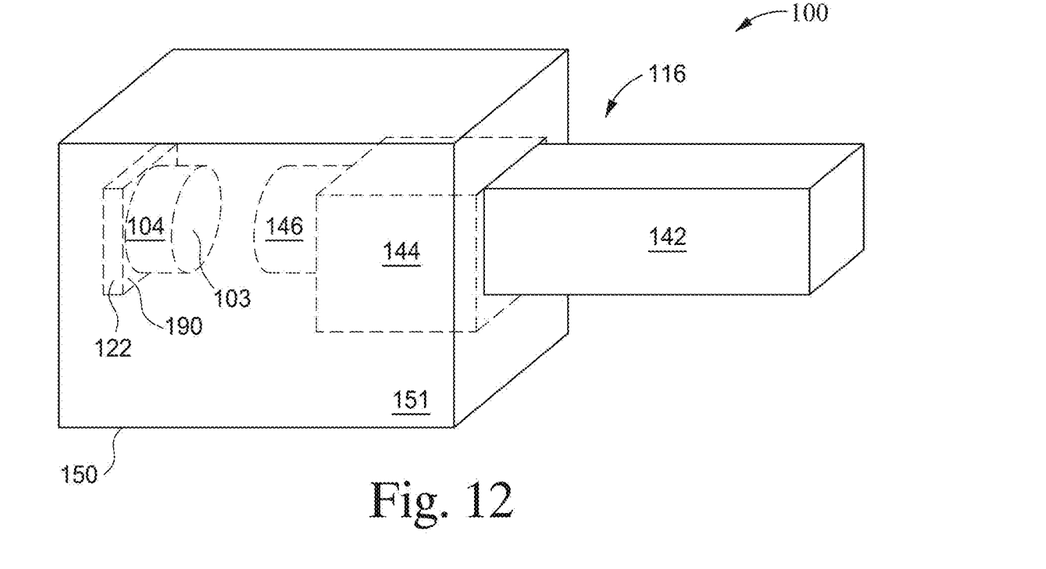
FIG. 12 illustrates an alternative schematic view of a laser machine and a laser device in accordance with the present disclosure.

FIGS. 11 and 12 depict schematic views of laser machines 100 that may be used to texturize the surface 103 of the component 104. In particular, FIGS. 11 and 12 show different arrangements, parts, and elements for the laser machine 100 and/or the laser device 116. As shown in FIG. 11, the laser machine 100 may have a vertical orientation with respect to the component 104, or the laser device 116 may have a horizontal orientation with respect to the component 104, as shown in FIG. 12. As discussed above, the component 104 is used in a semiconductor processing chamber. The component 104 may be, for example, a gas distribution showerhead, a shield, a chamber liner, a cover ring, a clamp ring, a substrate support pedestal, and/or an electrostatic chuck. Thus, after being texturized with the laser machine 100, the component 104 is used as a component of the semiconductor processing chamber, in which semiconductors, such as wafers, are processed within the semiconductor processing chamber.

As discussed above, the laser device 116 is used to output a beam of photons. The laser device 116 in FIGS. 11 and 12 is shown to include a light source 142, such as a photon light source, an optical module 144, and a lens 146, each operably coupled to each other. However, in other embodiments, though the laser device 116 is shown as including the light source 142, the optical module 144, and the lens 146, the present disclosure is not so limited. For example, in one or more other embodiments, the power supply 106 and/or the controller 108 shown in FIGS. 1 and 2 may additionally or alternatively include the light source 142, the optical module 144, and/or the lens 146 without departing from the scope of the present disclosure.

The light source 142 is used to generate a source of light, and in particular a stream of photons in this embodiment. The optical module 144 operably coupled to the light source 142 receives the stream of photons from the light source 142 to shape, direct, or otherwise modulate the stream of photons from the light source 142. The optical module 144 includes a beam modulator and a beam scanner with the beam scanner positioned downstream (with respect to the light source 142) from the beam modulator. The beam modulator receives the stream of photons from the light source 142 to create a beam of photons from the stream of photons. For example, the beam modulator may be used to create a beam of photons with a single focal point by shaping the stream of photons from the light source 142. The beam scanner is used to receive the beam of photons from the beam modulator to scan the beam of photons across the surface 103 of the component 104. Thus, the beam scanner is used to move, deflect, and otherwise control the direction of the beam of photons, such as through the use of an electromechanical actuator.

The lens 146 is used to receive the beam of photons from the optical module 144, and more particularly from the beam scanner, to distribute the beam of photons across the surface 103 of the component 104. As the beam modulator of the optical module 144 is used to focus the stream of photons into a beam of photons, such as a single focal point beam of photons, the lens 146 is used to defocus and equally distribute the beam of photons across a predetermined area or region. For example, the lens 146 may be used to distribute the beam of photons across an area of about 355 mm$^2$. The beam of photons distributed across the surface 103 of the component 104 is used to form one or more texturized features on the surface 103 of the component 104, such as depressions and/or protuberances on the surface 103 of the component 104.

The laser device 116 is used to control the power, speed, frequency, direction, distribution, and/or pulse(s) of the beam of photons emitted from the laser device 116 and scanned across the surface 103 of the component 104. For example, the light source 142 and/or the optical module 144 may be used to pulse the beam of photons while the beam of photons are scanned across the surface 103 of the component 104. Further, the beam scanner of the optical module 144 may be used to direct or scan the beam of photons across the surface 103 of the component 104 in one or more predetermined patterns. In one embodiment, the beam scanner may be used to scan the beam of photons using a line-by-line pattern, a sparrow pattern, and/or a random pattern. A sparrow pattern includes scanning the beam of photons in an out-to-in or an in-to-out pattern with respect to a middle or central region of the surface 103 of the component 104, thus working in a radial pattern as opposed to a line-by-line pattern.

The laser device 116 is also used to distribute and scan the beam of photons vertically or horizontally from the lens 146 and towards the surface 103 of the component 104. A support 122 that includes a supporting surface 190 is shown in use with the laser machine 100 with the component 104 positioned between the lens 146 and the support 122. The supporting surface 190 is used to support the component 104 on the support 122, and thus the component 104 is positioned on the supporting surface 190 of the support 122 in the arrangement shown in FIG. 11 in which the beam of photons is distributed vertically towards the surface 103 of the component 104. The supporting surface 190 of the support 122 is used as a barrier behind the component 104 in the arrangement shown in FIG. 12 in which the beam of photons is distributed horizontally towards the surface 103 of the component 104. An advantage to the horizontal arrangement shown in FIG. 12 is that gravity may be used to pull material away from the surface 103 of the component 104, such as when the material melts. This may result in a cleaner process than when material is able to redeposit or form on the surface.

Referring still to FIGS. 11 and 12, a clean enclosure 150 or clean compartment is included for use with the laser machine 100. The clean enclosure 150 generally includes a processing region 151 in which the support 122 is disposed. For example, the component 104 is positioned within the clean enclosure 150 during the texturizing process, in which the processing region 151 of the clean enclosure 150 includes a filtration system that is able to maintain the processing region as a Class 1 environment in accordance with the classification parameters from ISO 14644-1. Further, the support 122 and at least a portion of the laser device 116, such as the lens 146, are positioned within the clean enclosure 150. As the laser machine 100 is used within a non-pressurized (e.g., atmospheric) environment, the pressure within the clean enclosure 150 may be generally equivalent to or about atmospheric pressure, or the pressure may be unregulated. The clean enclosure 150 may alternately and/or additionally be purged with an inert gas (e.g., $N_2$) to remove oxygen, water and/or other process contaminants. Additionally, a conveyor may be used to introduce the component 104 into the clean enclosure 150 and onto the support 122, and/or the conveyor may be used to remove the component 104 from the support 122 and out of the clean enclosure 150. For example, the support 122 may include the conveyor in such an embodiment. Alternatively, a separate robot arm or similar mechanism may be used to facilitate removing the component 104 from the conveyor and/or placing the component 104 on the conveyor.

Figure 13:
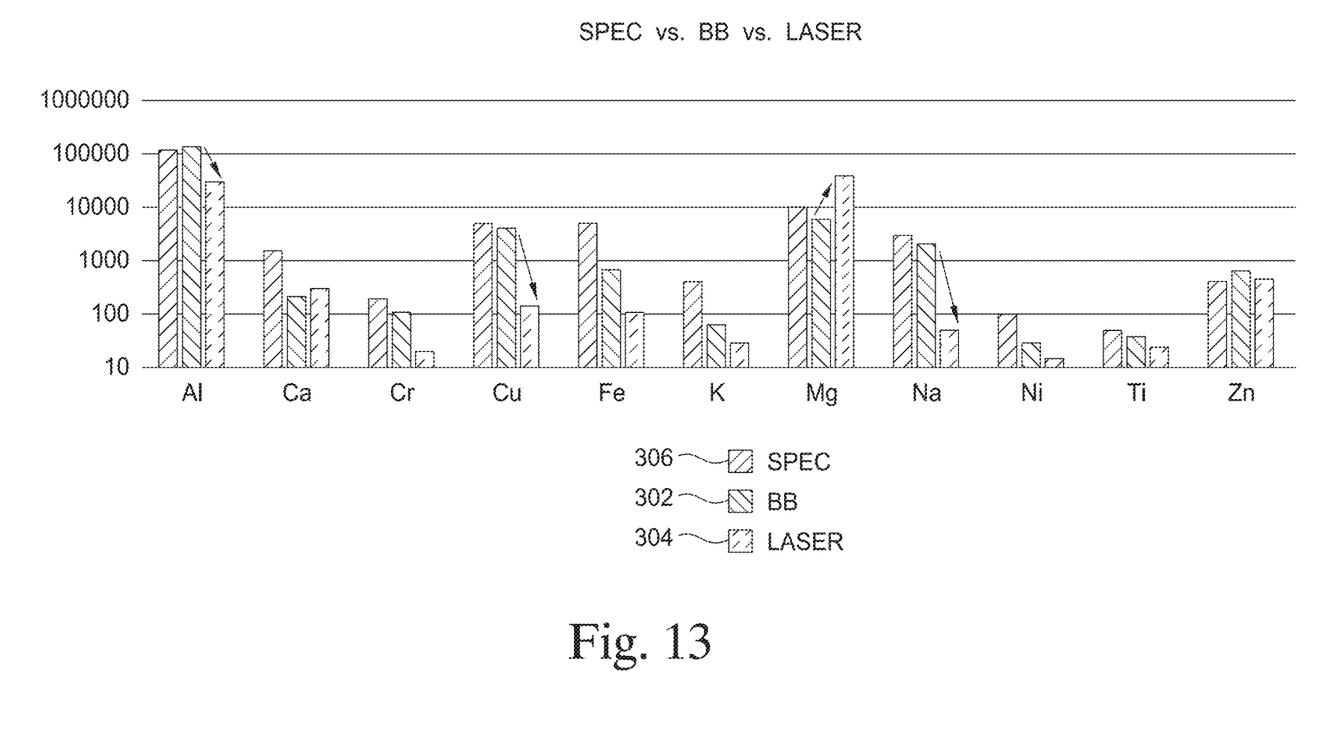
FIG. 13 shows a graphical view comparing results of components texturized using a bead blasting process and a process in accordance with the present disclosure.

FIG. 13 shows a graphical view comparing average elemental results of components that have been texturized using a bead blasting process 302, components that have been texturized using a laser process 304 in accordance with embodiments described herein, and a specification 306 generally required for components used within a semiconductor processing chamber. The x-axis provides the different elements (e.g., trace metals) tested in each of the components, and the y-axis provides the amount of the elements found on the surface of the component in units of atoms/$cm^2$. As shown, a component texturized using the laser process 304 generally had less elements or trace metals than those required by the specification 306, and also generally had less elements or trace metals than those texturized using the bead blasting process 302. For example, as beads used in the bead blasting process 302 generally include sodium (Na), there was a significant decrease in the amount of sodium for components texturized using the laser process 304 as opposed to the bead blasting process 302. Components texturized using the laser process 304 may generally result in having a higher amount of magnesium (Mg), but these components can subsequently be cleaned using diluted acid and high purity water (e.g., hot deionized water) to remove the excess magnesium. Accordingly, components texturized using the laser process 304 resulted in higher yields during subsequent semiconductor processing, such as around 95%, compared to components texturized using the bead blasting process 302, which could be expected to be around 50%.

While the foregoing is directed to implementation of the present disclosure, other and further implementation of the disclosure may be devised without departing from the basic scope thereof, and the scope thereof is determined by the claims that follow.

What is claimed is:

1. A method of providing a texture to a surface of a component for use in a semiconductor processing chamber, comprising:
   generating a stream of photons;
   shaping the stream of photons into a beam of photons;
   scanning the beam of photons through a processing region that comprises a gas concentration of ambient air or nitrogen with a pressure generally equivalent to atmospheric pressure towards the surface of the component; and
   distributing the beam of photons across the surface of the component to form a plurality of features on the surface.

2. The method of claim 1, further comprising assembling the semiconductor processing chamber with the component.

3. The method of claim 2, further comprising processing a semiconductor within the semiconductor processing chamber.

4. The method of claim 1, further comprising positioning the component within an enclosure maintained as a Class 1 environment.

5. The method of claim 4, wherein the positioning comprises using a conveyor to convey the component into the Class 1 environment.

6. The method of claim 1, wherein the distributing comprises distributing the beam of photons horizontally towards the surface of the component.

7. The method of claim 1, wherein the distributing the beam of photons comprises pulsing the beam of photons while scanning the beam of photons across the surface of the component, wherein the beam of photons comprises a wavelength in a range between about 345 nm and about 1100 nm and the plurality of features that are formed comprise depressions, protuberances, or combinations thereof.

8. A method of providing a texture to a surface of a component for use in a semiconductor processing chamber, comprising:
   generating a stream of photons;
   shaping the stream of photons into a beam of photons;
   scanning the beam of photons through a processing region towards the surface of the component; and
   distributing the beam of photons at a wavelength in a range between about 345 nm and about 1100 nm across the surface of the component to form a plurality of features on the surface.

9. The method of claim 8, wherein the distributing comprises distributing the beam of photons horizontally towards the surface of the component.

10. The method of claim 8, wherein the distributing comprises distributing the beam of photons vertically towards the surface of the component.

11. The method of claim 8, further comprising assembling the semiconductor processing chamber with the component.

12. The method of claim 11, further comprising processing a semiconductor within the semiconductor processing chamber.

13. The method of claim 8, further comprising positioning the component within an enclosure maintained as a Class 1 environment.

14. The method of claim 13, wherein the positioning comprises using a conveyor to convey the component into the Class 1 environment.

15. The method of claim 8, wherein the distributing the beam of photons comprises pulsing the beam of photons while scanning the beam of photons across the surface of the component, wherein the plurality of features that are formed comprise depressions, protuberances, or combinations thereof.

16. A method of providing a texture to a surface of a component for use in a semiconductor processing chamber, comprising:
  generating a stream of photons;
  shaping the stream of photons into a beam of photons;
  scanning the beam of photons through a processing region towards the surface of the component; and
  pulsing the beam of photons while scanning the beam of photons across the surface of the component to form a plurality of features on the surface.

17. The method of claim 16, further comprising assembling the semiconductor processing chamber with the component.

18. The method of claim 17, further comprising processing a semiconductor within the semiconductor processing chamber.

19. The method of claim 16, further comprising using a conveyor to convey the component within an enclosure maintained as a Class 1 environment.

20. The method of claim 16, wherein the beam of photons comprises a wavelength in a range between about 345 nm and about 1100 nm and the plurality of features that are formed comprise depressions, protuberances, or combinations thereof.

* * * * *